US010572168B2

(12) United States Patent
Parikh et al.

(10) Patent No.: US 10,572,168 B2
(45) Date of Patent: Feb. 25, 2020

(54) DRAM BANK ACTIVATION MANAGEMENT (71) Applicant: International Business Machines Corporation, Armonk, NY (US)

(72) Inventors: Dharmesh Parikh, Bangalore (IN); Stephen J. Powell, Austin, TX (US); Venkata K. Tavva, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/814,646

(22) Filed: Nov. 16, 2017

(65) Prior Publication Data

US 2019/0146694 A1 May 16, 2019

(51) Int. Cl.
*G06F 3/06* (2006.01)
(52) U.S. Cl.
CPC .......... *G06F 3/0625* (2013.01); *G06F 3/0634* (2013.01); *G06F 3/0659* (2013.01); *G06F 3/0683* (2013.01)
(58) Field of Classification Search
CPC .... G06F 3/0625; G06F 3/0683; G06F 3/0659; G06F 3/0634; G06F 3/06
USPC ........................................................ 711/105
See application file for complete search history.

(56) References Cited

U.S. PATENT DOCUMENTS

| | | | |
|---|---|---|---|
| 7,392,339 B2 | 6/2008 | David | |
| 9,355,704 B2 | 5/2016 | Lai | |
| 9,542,353 B2 | 1/2017 | Rajan et al. | |
| 2005/0235130 A1* | 10/2005 | Barth | G06F 1/3225 711/170 |
| 2005/0240745 A1* | 10/2005 | Iyer | G06F 12/0223 711/167 |
| 2006/0288240 A1* | 12/2006 | Kardach | G06F 1/3228 713/300 |
| 2013/0282972 A1* | 10/2013 | Nazm Bojnordi | G06F 3/0611 711/105 |
| 2014/0104937 A1 | 4/2014 | Andre et al. | |
| 2015/0317096 A1 | 11/2015 | Bains | |
| 2016/0034406 A1* | 2/2016 | Hansson | G06F 13/1673 711/105 |
| 2016/0216912 A1 | 7/2016 | Muralimanohar et al. | |
| 2017/0168727 A1 | 6/2017 | Alavoine | |

OTHER PUBLICATIONS

Search and Examination Report from UK Intellectual Property Office for related application, dated Apr. 29, 2019.

* cited by examiner

*Primary Examiner* — Pierre Miche Bataille
(74) *Attorney, Agent, or Firm* — Lieberman & Brandsdorfer, LLC (57) ABSTRACT

A system, method, and computer program product are provided herein to manage DRAM bank activation per cycle. A memory controller with embedded scheduling logic is employed to manage the system, method, and computer program product and to restrict the quantity of active banks in a given cycle, resulting in power savings with minimal performance loss, if any. The scheduling logic provides instructions to manage the state of associated DRAM banks. Each bank is either in an idle state or an active state, with the idle state consuming less power than the active state. The scheduling logic restricts the quantity of active banks in any cycle, with all other banks being in an idle state, which provides power savings to the associated system.

20 Claims, 5 Drawing Sheets

DRAM BANK ACTIVATION MANAGEMENT

BACKGROUND

The present embodiments relates to management of one or more banks in DRAM. More specifically, the embodiments relate to power consumption associated with the DRAM through control of the operating state of the banks, and mitigating creation of an empty cycle on an associated data bus.

Memory is divided into two categories, referred to as volatile and non-volatile. Volatile memory is computer storage that only maintains data while an associated device receives power. At such time as power is removed, the data ceases to be maintained. An example of volatile memory, also referred to herein as volatile storage, is random access memory, e.g. RAM. Non-volatile memory is a form of computer storage that does not require continuous power to retain the data stored in an associated storage device. An example of non-volatile memory, also referred to herein as non-volatile storage, is a hard disk drive, e.g. HDD, a solid state drive, e.g. SSD, or a universal serial bus drive, e.g. USB.

Dynamic random access memory, hereinafter referred to as DRAM, is a multi-dimensional memory. The DRAM resides in modules inserted into the motherboard and is sometimes referred to as RAM. It is called dynamic because it must be continually refreshed so as not to lose the stored data. DRAM is contrasted with static RAM (SRAM), which is used for cache inside or near the central processing unit (CPU). As described herein, the DRAM is a multi-dimensional memory structure, with different operating states and each of the operating states having an associated power consumption usage.

SUMMARY

A system, computer program product, and method are provided for managing the operating states of the banks in the hierarchy of the DRAM memory.

In one aspect, a computer system is provided with a processing unit operatively coupled to DRAM. A memory controller is operatively coupled to the DRAM and a read queue and a write queue. The memory controller is configured to manage the DRAM. This management includes the memory controller tracking an operating state of each DRAM bank in a rank. The state may be active, waiting for a CAS command, or idle. The memory controller tracks a quantity of outstanding CAS commands in one of the queues in relation to the tracked operating state of each bank. The outstanding CAS commands may be under-service of the CAS and/or waiting for service of the CAS. For each cycle, the memory controller identifies the tracked quantity of CAS commands waiting for service in a selected queue and assesses the identified quantity in view of a predefined ratio. The memory controller manages the operating state of the banks based on the cycle assessment, including individual control of the operating state of each of the banks, with an understanding that an idle state consumes less power than an active state, and individual control of the operating state includes delaying activation of a bank in the DRAM that is in an idle state.

In another aspect, a computer program product is provided for managing DRAM. The computer program product comprises a computer readable storage device having program code embodied therewith. The program code is executable by a processing unit to track an operating state of each DRAM bank in a rank. The operating state may be active, waiting for a CAS command, or idle. The program code tracks a quantity of outstanding CAS commands in a request queue in relation to the tracked operating state of each bank. The outstanding CAS commands include under-service of the CAS or waiting for service of the CAS. For each cycle, the program code identifies the tracked quantity of CAS commands waiting for service in a selected queue for the current cycle and assesses the identified quantity in view of a predefined ratio. The program code manages the operating state of the banks based on the cycle assessment. This management includes individually controlling the operating state of each of the banks, wherein the idle state consumes less power than the active state. The individual control of the operating state includes the program code delaying activation of a bank in the DRAM that is in an idle state.

In yet another aspect, a method is provided for managing operation of the DRAM. An operating state of each DRAM bank in a rank is tracked. The bank operating state may be active, waiting for a CAS command, or idle. Two quantities in the DRAM are tracked. One of the tracked quantities is outstanding CAS commands in a request queue which is tracked in relation to the tracked operating state of each bank. Another of the tracked quantity is outstanding CAS commands in a request queue in relation to the tracked state of each bank. The outstanding CAS commands are under-service of the CAS and/or waiting for service of the CAS. For each cycle, the tracked quantity of CAS commands waiting for service in a selected queue for the current cycle are identified, and this identified quantity is assessed in view of a predefined ratio. The operating state of the banks is managed based on the cycle assessment. This management includes individually controlling the operating state of each of the banks, including delaying activation of a bank that is in the idle state.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The subject matter which is regarded as embodiments is particularly pointed out and distinctly claimed in the claims at the conclusion of the Specification. The forgoing and other features, and advantages of the embodiments are apparent from the following details description taken in conjunction with the accompanying drawings in which:

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As described herein, computer memory is organized into a hierarchy. Registers, SRAM and DRAM are all forms of volatile memory. The DRAM is a computer chip logically subdivided into a multi-dimensional form, with the dimensions including bank row, and column for addressing. A DRAM rank is an independent set of DRAM chips on a module that is addressed independently. A DRAM bank is a logical storage unit. In one embodiment, the bank consists of multiple columns and rows of storage units across several chips. A system, method, and computer program product are disclosed herein to manage DRAM bank activation during every cycle. Scheduling logic is employed to manage the system, method, and computer program product and to restrict the quantity of active banks in a given cycle, resulting in power savings with minimal performance loss, if any. The scheduling logic provides instructions to manage the state of associated DRAM banks. Each bank is either in an idle state or an active state. It is understood that the idle state consumes less power than the active state. Accordingly, maintaining one or more inactive DRAM banks in an idle state provides power savings to the associated system.

Figure 1:
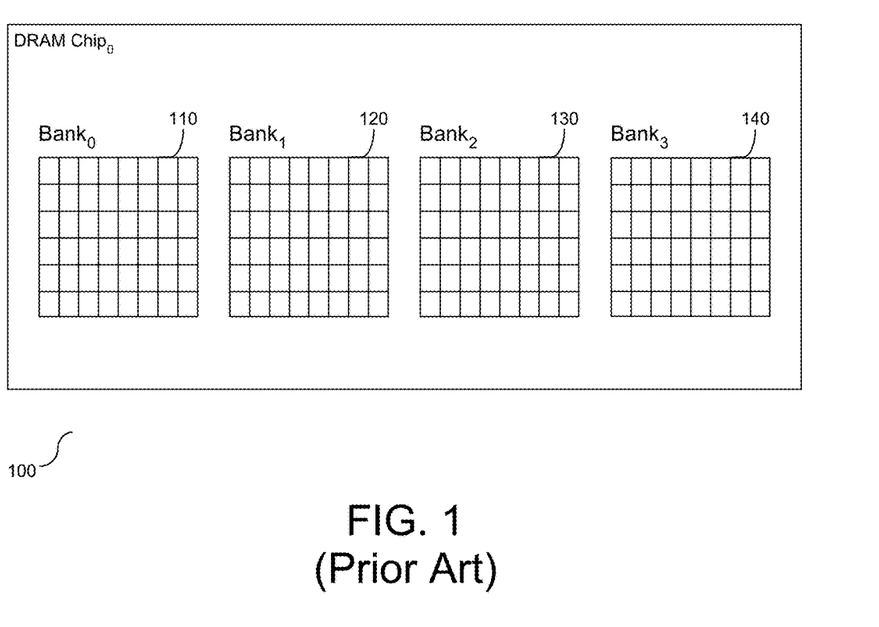
FIG. 1 depicts a block diagram illustrating a prior art block diagram of a DRAM chip.

Referring to FIG. 1, a prior art block diagram (100) of a DRAM chip is provided. As shown, the chip has four banks, referred to herein as $bank_0$ (110), $bank_1$ (120), $bank_2$ (130), and $bank_3$ (140). Although only four banks are shown, this quantity should not be considered limiting. In one embodiment, the chip may be configured with eight, sixteen or thirty-two banks. Each bank is divided into rows and columns. In the example shown herein, $bank_0$ (110) has M rows and N columns. The quantity of rows and columns are for explanatory purposes and should not be considered limiting. $Bank_1$ (120), $bank_2$ (130), and $bank_3$ (140) are similarly configured to $bank_0$ (110). The example shown herein is limited to a select portion of the rows and is merely for illustrative purposes. Each bank is shown with 6 rows and 8 columns. Columns are defined by width and may be configured as four-bits (x4), eight-bits (8x), or sixteen-bits (x16). Accordingly, the DRAM chip shown herein is an x8 DRAM.

The DRAM example shown in FIG. 1 demonstrates the three-dimensional characteristics of the memory, with the dimensions in a rank identified as bank, row, and column. Each bank operates independently of other banks in the rank, and contains an array of memory cells that are accessed on a row basis, e.g. as an entire row at a time. In one embodiment, the row is referred to as a memory page. When a row of the memory array is accessed, referred to as row activation, the entire row of the memory array is transferred into a buffer, referred to herein as a row buffer. In one embodiment, in order to access a row, both the memory bank and row address are specified. The row buffer serves as a cache, and thereby reduces latency of subsequent accesses to that row. While the row is active in the row buffer, read or write may be performed. The write is referred to herein as a write access. After completing an available column access to the cached row, the cached row is written back to the memory array in an operation referred to as a bank pre-charge, hereinafter referred to as pre-charge. The pre-charge prepares the bank for subsequent row activation, which may be any row in the bank. Accordingly, the purpose of pre-charging is to close a current row and to allow activation of another row.

Access to data stored in the DRAM is managed by a memory controller, e.g. MC, and as described in detail below, managed by logic embedded in the MC. The CPU sends a memory request to the MC over an address bus. Multiple ranks share a common resource, referred to as a bus. Similarly, multiple banks in a rank share a common address bus and data bus. The MC receives the address associated with the memory request and divides the address into rank address, bank address, row address, and column address within the bank. The MC accesses the appropriate row via a row access strobe (RAS) at the row address. The MC accesses the appropriate column via a column access strobe (CAS) at the column address(es), and the requested data is output to the MC on the data bus. Periodically, the MC may issue a refresh command, e.g. REF, in order not to lose data in an associated DRAM cell.

It is understood that there are several delays embedded in the memory request and the associated operations. These delays are referred to as latency and they embody the delays between when a request is made and when the request is serviced. Several of the latencies are defined as follows: CAS latency, e.g. tCAS, is the time between when a CAS signal is received and when the data is available, RAS to CAS latency, e.g. tRCD, is the time required between RAS and CAS access, RAS pre-charge, e.g. tRP, is the time required to close the row buffer and pre-charge in the bank, and cycle time, e.g. tRAS, is the time required to read a row and write it to the row-buffer. Accordingly, there are several latencies embedded in the structure of the DRAM.

In addition to the embedded latencies, there are also physical restrictions associated with processing read and write requests. Namely, the structure of the DRAM is limited by a shared address bus. As shown and described in FIG. 4, multiple DRAM ranks share the address and the data bus. In relation to the commands that effectuate the request, the pre-charge, row activation, and column access share the common address bus. Accordingly, contention across the bus needs to be managed as a factor in processing read and write requests.

It is understood that multiple banks contend for the common address bus and data bus. The MC, and more specifically the embedded logic of the MC, functions to manage a schedule that accommodates timing and resource constraints of the DRAM. Each DRAM bank has two stable states, referred to herein as active and idle. It is understood that in comparison, a bank in the idle state consumes less power than a bank in the active state. The memory controller tracks the banks that are in the active state in each of the ranks. In the idle state the DRAM is pre-charged and ready for row access. There is no open row in the idle state. The DRAM remains in the idle state until a row activate operation is issued to the bank. Although no other operations may be issued to the bank undergoing the row activate operation, during that time operations may be issued to other banks of the DRAM. Once the DRAM's activation latency has passed, the bank enters the active state and contents of the selected row are held in the bank's row buffer. The bank remains in the active state until a pre-charge operation is issued to return the bank to the idle state. The pre-charge operation requires the use of an address line to indicate or identify the bank which is subject to the pre-charge. The pre-charge operation utilizes bank resources for a defined quantity of cycles, during which no operations may be issued to that bank. To issue either a read or write column access, the address lines are required to indicate the bank and column of the active row in that bank. After the pre-charge latency, the bank is returned to the idle state and is ready for a new row activation operation. Accordingly, the MC functions to manage a schedule associated with the defined latencies and the associated bank states.

Memory access scheduling is a process of ordering and sequencing of the DRAM operations, e.g. pre-charge, row activation, and column access, necessary to complete a set of pending memory references. The MC has complete information for each rank and bank for efficient utilization thereof. The MC, and specifically memory access scheduling, incorporates power consumption of the DRAM bank. In each stable state, the DRAM bank consumes power. As a relative comparison, the DRAM bank consumes less power in the idle state as compared to the active state, and as such, it is preferable for each bank to be in an idle state when the bank is not in use. In addition to the defined bank states and associated operation, the time required to transfer data across the data bus is also required to be considered. This time is referred to as a burst length, e.g. BL. For example, in one embodiment, the BL is four DRAM cycles. Memory logic associated with the MC determines the most beneficial command to issue to the ranks during every cycle, while taking into consideration the limitations of the common address and data buses.

It is understood that aggressive activation of banks may not result in increased performance. More specifically, complete utilization, e.g. 100 percent utilization, of the data bus for data transfer increases power consumption without improving performance. The goal is to enable the banks to each remain in an idle state as long as possible while supporting read and write requests and at the same time addressing contention for the data bus. One solution is to impose a restriction on the number of banks in a rank that can be active at any given moment, thereby reducing power consumption. This solution reduces scheduler complexity by reducing the quantity of contenders for the address bus. The policy of denying an activate request of a bank in a rank does not impact on service time for a waiting request, because even if the activate request was issued in the current cycle, it will have to wait until all current CAS requests are serviced. In other words, the data bus is busy with the current CAS requests. Invoking the policy of denying activation of a bank actually reduces power consumption. Accordingly, there is a need for designing and invoking a policy of managing activation of banks under specific conditions in order to manage power consumption and DRAM performance.

Figure 2:
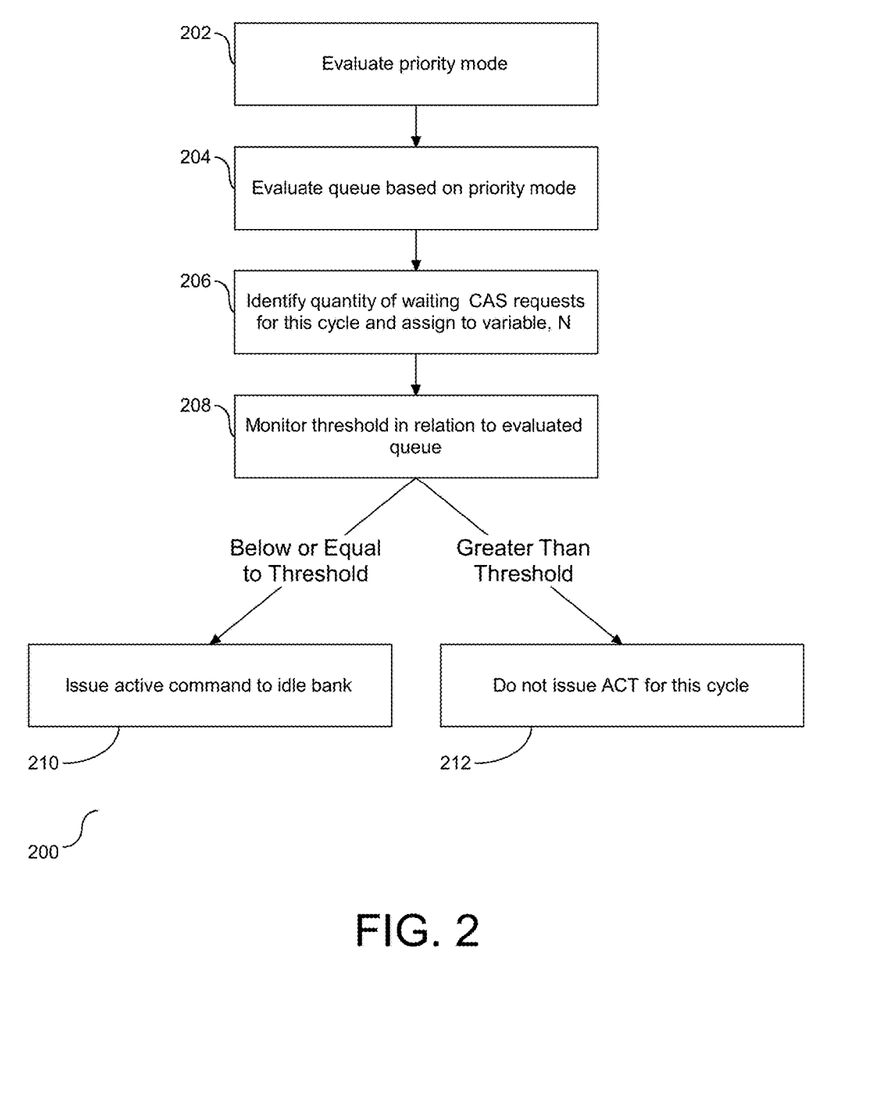
FIG. 2 depicts a flow chart illustrating a process for managing data requests in DRAM.

Referring to FIG. 2, a flow chart (200) is provided illustrating a method for managing data requests in DRAM. It is understood that there are two queues associated with the DRAM MC, including a read queue and a write queue. The MC tracks the quantity of banks active in each rank and the quantity of CAS requests under-service or waiting for service in the identified active banks in each rank. Pending read requests are placed in the read queue. Similarly, pending write requests are placed in the write queue. The priority mode of the memory is evaluated (202). For every cycle, the read request queue and the write request queue are reviewed. Based on the evaluation at step (202), either the read request queue or the write request queue is evaluated (204). Specifically, the priority mode identifies the queue at step (202) and based on the identification, the queue is evaluated for any pending CAS requests at step (204). Each CAS request includes an activate command that identifies a row in the bank to support the identified column and also opens the row. Accordingly, the CAS request inherently knows the row that supports the CAS request.

Following step (204), the quantity of CAS requests waiting to be serviced for this cycle are identified and assigned to the variable N (206). The physical parameters of the processing cycle are considered in calculating the quantity of CAS requests that are sufficient to delay activation of an idle bank. Following step (206), an identified threshold value is monitored in relation to the evaluated queue with the waiting CAS requests (208). When the number of CAS requests in the queue is equal to or below the threshold value, the scheduler issues an activate command to an idle bank in the rank (210). Conversely, if the number of CAS requests in the queue is greater than the threshold value, the scheduler will not issue an activate request in the current cycle (212). Issuance of the activate command at step (210) changes the state of a subject bank from idle to active, which utilizes resources and increases power consumption. At such time as a new activate command is issued at step (210) and a bank is opened, the new CAS request associated with this bank might not issue until the prior CAS requests in the queue evaluated at step (204) have been processed. As shown, the scheduler employs a policy of tracking a quantity of active banks in each rank and a quantity of CAS commands under service or waiting for service by the active banks in relation to the ratio of active banks in each rank to the quantity of CAS commands and for each cycle of the address bus. Accordingly, the state of the banks in each rank is managed with respect to the CAS requests pending in an evaluated queue.

Figure 3:
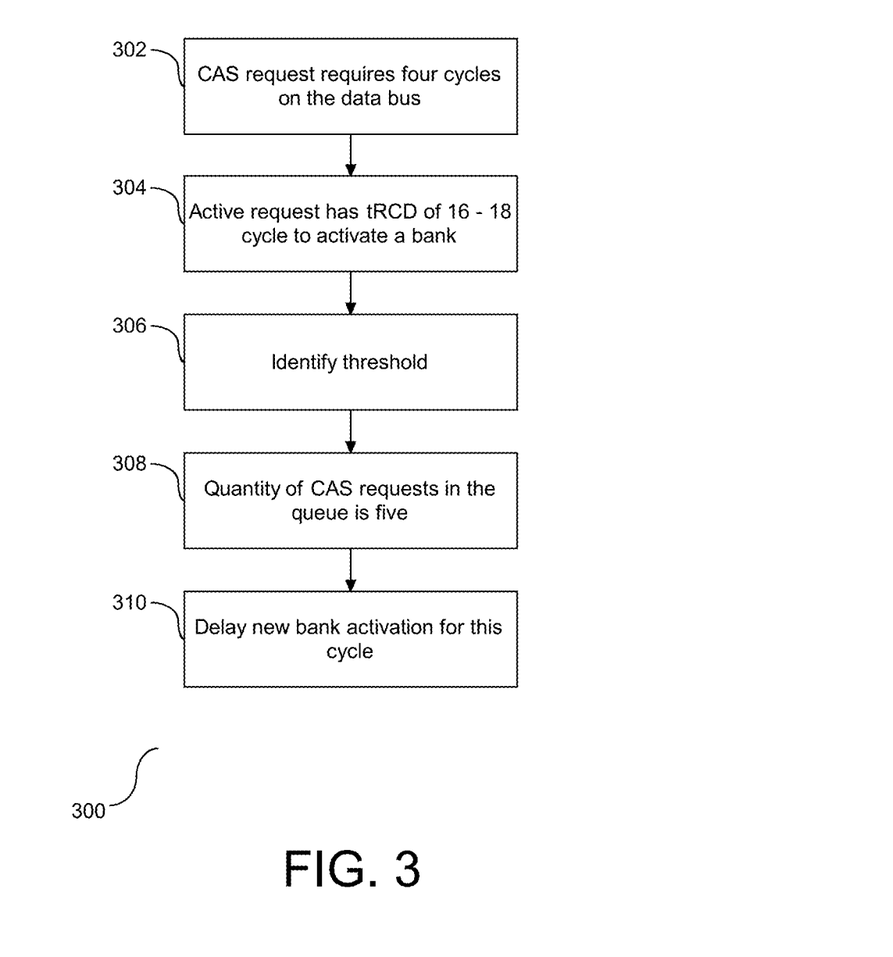
FIG. 3 depicts a flow chart illustrating an example of the management shown and described in FIG. 2.

Referring to FIG. 3, a flow chart (300) is provided demonstrating an example of the management shown and described in FIG. 2. It is determined that the CAS request requires four cycles on the data bus to process (302). Similarly, it is determined that each activate request has a tRCD of sixteen to eighteen cycles to activate a bank (304). The threshold value is identified as a quotient of the tRCD and the BL (306). More specifically, the threshold value yields the quantity of CAS requests in the queue that are sufficient to keep the data bus busy until new bank activation completes. In one embodiment, this quotient or ratio is predefined or configurable. Similarly, in one embodiment, this quotient or ratio is calculated for every cycle by the memory controller or scheduler. In this example, the quantity of CAS requests in the queue is determined to be five (308). As such, the new bank activation command is delayed based on the cycle assessment and not issued for this cycle (310). Accordingly, the new bank activation is delayed in this example without losing data bus utilization.

As demonstrated in FIGS. 2 and 3, in any given cycle, when the MC finds that enough CAS requests are pending or waiting, the MC will not issue a new bank activation command. Only when the number of CAS requests waiting in the identified queue falls below a quantified threshold, the MC will issue a new bank activation command. In one embodiment, if the MC finds multiple banks waiting for the new bank activation command issuance, the MC can select a bank by adopting a scheduling policy. Issuance of the bank activation command by the MC is subject to evaluation of the read or write queue as identified by the priority mode, as demonstrated in FIG. 2. When look-up of CAS requests waiting for service in the identified queue takes place, either the read queue (RQ) or the write queue (WQ) is selected for evaluation based on a current priority mode. For example, the RQ is reviewed during read priority mode and the WQ reviewed during write priority mode. In one embodiment, both the RQ and the WQ can be reviewed for counting. With respect to the pending CAS requests in the selected queue, CAS requests are counted for the current rank under service or all ranks, e.g. one or all. Similarly, with respect to a policy for the new bank activation, the policy can be selective to read requests or write requests, or in one embodiment, for both read and write requests. In one embodiment, different channels of communication may be subject to different variants of the new bank activation policy.

Figure 4:
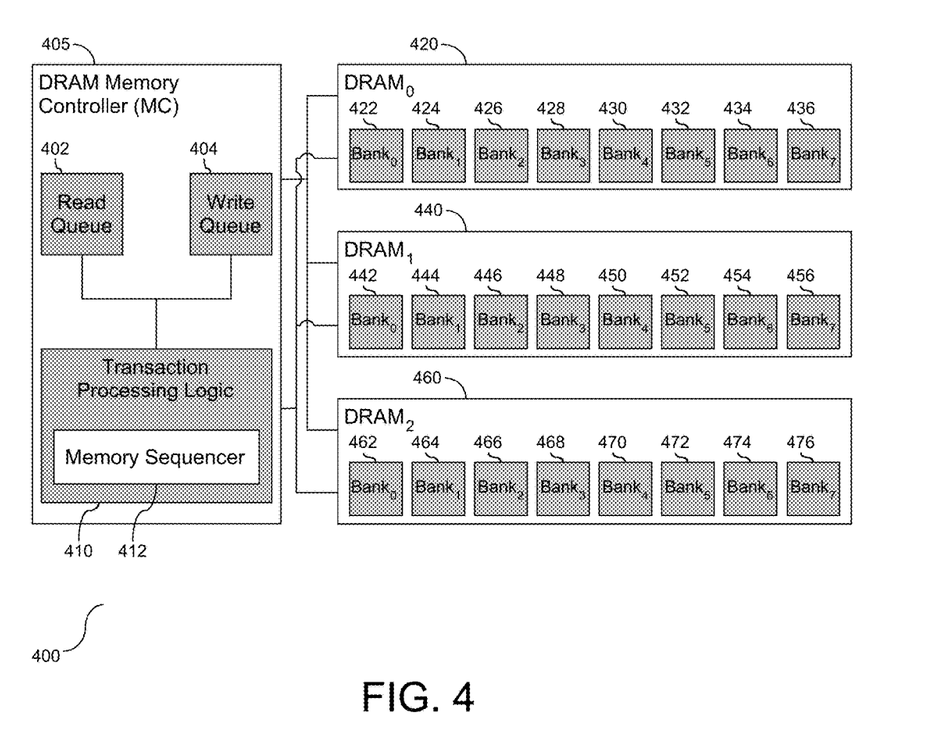
FIG. 4 depicts a block diagram illustrating a DRAM memory controller.

Referring to FIG. 4, a block diagram (400) is provided illustrating a DRAM memory controller. As shown, the MC (405) includes an RQ (402) and a WQ (404), both operatively coupled to transaction processing logic (410) and a memory sequencer (412). As shown, the memory sequencer (412) is part of the transaction processing logic (410). Scheduling decisions for activation (ACT) issuance is supervised by the logic (410). In one embodiment, memory sequencing and scheduler logic, as demonstrated in FIGS. 2-3, is part of the transaction processing logic (410). The MC (405) is shown operatively coupled to DRAM devices (420), (440), and (460). In this example, there are three DRAM devices, although this quantity should not be considered limiting, and in one embodiment may include additional memory devices. As explained above, a rank is an independent set of DRAM chips on a module that is addressed independently. In the example shown herein, there are three ranks, $DRAM_0$ (420), $DRAM_1$ (440), and $DRAM_2$ (460). $DRAM_0$ (420) is shown with six banks, including $bank_0$ (422), $bank_1$ (424), $bank_2$ (426), $bank_3$ (428), $bank_4$ (430), and $bank_5$ (432); $DRAM_1$ (440) is shown with six banks, including $bank_0$ (442), $bank_1$ (444), $bank_2$ (446), $bank_3$ (448), $bank_4$ (450), and $bank_5$ (452); and $DRAM_2$ (460) is shown with six banks, including $bank_0$ (462), $bank_1$ (464), $bank_2$ (466), $bank_3$ (468), $bank_4$ (470), and $bank_5$ (472). Activation of the banks from idle to active modes is subject to the transaction processing logic (410) as supported by the RQ (402) and the WQ (404). More specifically, the transaction processing logic controls the state of one or more banks in each of the ranks. For example, in one embodiment, the logic (410) may identify at least two banks in an idle state and select one of the two banks responsive to a scheduling policy. The logic (410) changes the state of the selected bank from idle to active, while the non-selected bank(s) remains unchanged and in the idle state. Accordingly, the process of managing CAS requests and scheduling of ACT issuance decisions is controlled by the transaction processing logic.

The computer system described above in FIG. 4 has been labeled with a tool in the form of logic. The tool may be implemented in programmable hardware devices such as field programmable gate arrays, programmable array logic, programmable logic devices, or the like. The tool may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tool need not be physically located together, but may comprise disparate instructions stored in different locations which, when joined logically together, comprise the tool and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of the embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

Figure 5:
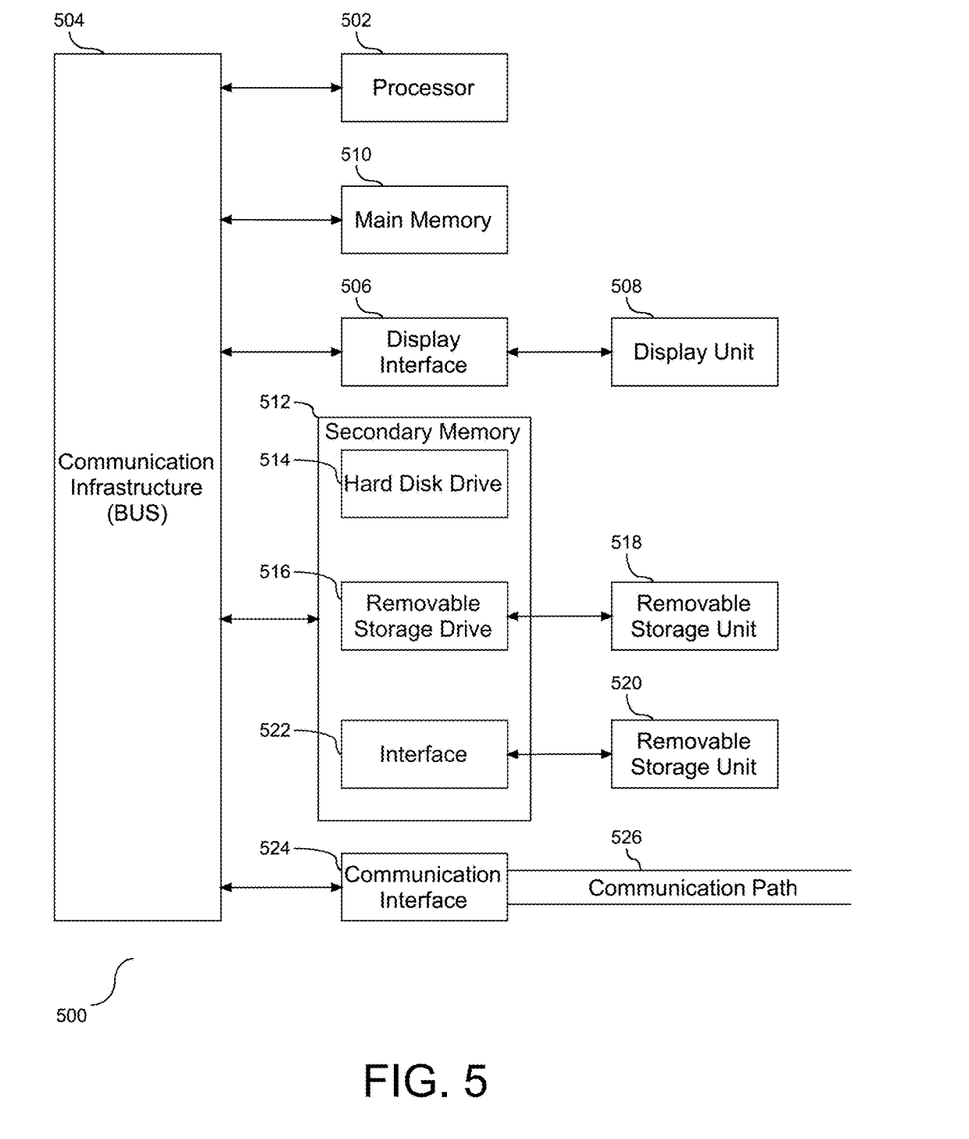
FIG. 5 depicts a block diagram of a system to implement an embodiment of the present embodiments.

Referring now to the block diagram of FIG. 5, additional details are now described with respect to implementing an embodiment of the present embodiments. The computer system includes one or more processors, such as a processor (502). The processor (502) is connected to a communication infrastructure (504) (e.g., a communications bus, cross-over bar, or network).

The computer system can include a display interface (506) that forwards graphics, text, and other data from the communication infrastructure (504) (or from a frame buffer not shown) for display on a display unit (508). The computer system also includes a main memory (510), preferably random access memory (RAM) and DRAM, and may also include a secondary memory (512). The secondary memory (512) may include, for example, a hard disk drive (514) and/or a removable storage drive (516), representing, for example, a floppy disk drive, a magnetic tape drive, or an optical disk drive. The removable storage drive (516) reads from and/or writes to a removable storage unit (518) in a manner well known to those having ordinary skill in the art. Removable storage unit (518) represents, for example, a floppy disk, a compact disc, a magnetic tape, or an optical disk, etc., which is read by and written to by removable storage drive (516).

In alternative embodiments, the secondary memory (512) may include other similar means for allowing computer programs or other instructions to be loaded into the computer system. Such means may include, for example, a removable storage unit (520) and an interface (522). Examples of such means may include a program package and package interface (such as that found in video game devices), a removable memory chip (such as an EPROM, or PROM) and associated socket, and other removable storage units (520) and interfaces (522) which allow software and data to be transferred from the removable storage unit (520) to the computer system.

The computer system may also include a communications interface (524). Communications interface (524) allows software and data to be transferred between the computer system and external devices. Examples of communications interface (524) may include a modem, a network interface (such as an Ethernet card), a communications port, or a PCMCIA slot and card, etc. Software and data transferred via communications interface (524) is in the form of signals which may be, for example, electronic, electromagnetic, optical, or other signals capable of being received by communications interface (524). These signals are provided to communications interface (524) via a communications path (i.e., channel) (526). This communications path (526) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (510) and secondary memory (512), removable storage drive (516), and a hard disk installed in hard disk drive (514).

Computer programs (also called computer control logic) are stored in main memory (510) and/or secondary memory (512). Computer programs may also be received via a communication interface (524). Such computer programs, when run, enable the computer system to perform the features of the present embodiments as discussed herein. In particular, the computer programs, when run, enable the processor (502) to perform the features of the computer system. Accordingly, such computer programs represent controllers of the computer system.

The present embodiments may be a system, a method, and/or a computer program product. The computer program product may include a computer readable storage medium (or media) having computer readable program instructions thereon for causing a processor to carry out aspects of the present embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments have been chosen and described in order to best explain the principles of the embodiments and the practical application, and to enable others of ordinary skill in the art to understand the embodiments for various embodiments with various modifications as are suited to the particular use contemplated. Accordingly, the implementation of scheduling logic in management of the DRAM is employed to reduce power consumption by managing the state of the DRAM banks between the idle state and the active state, with the management being in relation to pending CAS requests and an assessed threshold value per cycle.

It will be appreciated that, although specific embodiments have been described herein for purposes of illustration, various modifications may be made without departing from the spirit and scope of the embodiments. In particular, management of the operating state of the banks effectively manages power consumption. To ensure minimizing performance impact, the DRAM management may be tuned. For example, a potential ACT issuance may be chosen when one or more outstanding CAS commands falls below the predefined ratio. In one embodiment, the MC is configurable to apply bank ACT management only to read or write request, or to both read and write request. Similarly, the MC may be configurable to apply bank ACT management to a select rank(s). The embodiments presented can be adopted to any memory technology that is arranged in banks and the method to access these banks is similar to DRAM, specifically, when the method of access to the bank involves issuing an activate. A few examples of such memory technologies include, but are not limited to, Spin-Transfer Torque RAM (STT RAM), Magnetoresistive RAM (MRAM), Phase Change Memory (PCM), etc. Accordingly, the scope of protection of the embodiments is limited only by the following claims and their equivalents.

What is claimed is:

1. A computer system comprising:
    a processing unit operatively coupled to DRAM;
    memory controller operatively coupled to the DRAM, the memory controller operatively coupled a read queue and a write queue;
    the memory controller to manage the DRAM, including:
        track an operating state of each DRAM bank in a rank, wherein the state is selected from the group consisting of: active, waiting for a CAS command, and idle;
        track a quantity of outstanding CAS commands in one of the queues in relation to the tracked operating state of each bank, wherein the outstanding CAS commands are selected from the group consisting of: under-service of the CAS, and waiting for service of the CAS;
        for each cycle, identify the tracked quantity of CAS commands waiting for service in a selected queue for the current cycle, and assess the identified quantity in view of a predefined ratio; and
        manage the operating state of the banks based on the cycle assessment, including individually control the operating state of each of the banks, wherein the idle state consumes less power than the active state, and individual control of the operating state includes delaying activation of an idle bank.

2. The system of claim 1, wherein management of the operating state of the tracked banks further comprises the memory controller to restrict the quantity of active banks for the current cycle.

3. The system of claim 2, further comprising the memory controller to schedule issuance of an activate command to an idle bank, wherein the scheduling includes the memory controller to delay activation of the idle bank based on the cycle assessment.

4. The system of claim 1, further comprising the memory controller to identify at least two banks in the idle state, and select one of the banks responsive a scheduling policy, and change the state of the selected bank from idle to active.

5. The system of claim 4, wherein the scheduling policy includes for each cycle tracking a number of active banks in each rank and a number of CAS commands under service or waiting for service to the active banks in relation to the ratio.

6. The system of claim 1, wherein the predefined ratio is calculated by a memory scheduler.

7. The system of claim 1, wherein the predefined ratio is configurable.

8. A computer implemented method for managing DRAM comprising:
    tracking an operating state of each DRAM bank in a rank, wherein the state is selected from the group consisting of: active, waiting for a CAS command, and idle;
    tracking a quantity of outstanding CAS commands in a request queue in relation to the tracked operating state of each bank, wherein the outstanding CAS commands are selected from the group consisting of: under-service of the CAS, and waiting for service of the CAS;

for each cycle, identifying the tracked quantity of CAS commands waiting for service in a selected queue for the current cycle, and assessing the identified quantity in view of a predefined ratio; and managing the operating state of the banks based on the cycle assessment, including individually controlling the operating state of each of the banks, wherein the idle state consumes less power than the active state, and individual controlling the operating state includes delaying activation of an idle bank.

9. The method of claim 8, wherein managing an operating state of the tracked banks further comprises, restricting the quantity of active banks for the current cycle.

10. The method of claim 9, further comprising scheduling issuance of an activate command to an idle bank, wherein the scheduling includes delaying activation of the idle bank based on the cycle assessment.

11. The method of claim 8, further comprising identifying at least two banks in the idle state, and selecting one of the banks responsive a scheduling policy, and changing the state of the selected bank from idle to active.

12. The method of claim 11, wherein the scheduling policy includes for each cycle tracking a number of active banks in each rank and a number of CAS commands under service or waiting for service to the active banks in relation to the ratio.

13. The method of claim 8, wherein the predefined ratio is calculated by a memory scheduler.

14. A computer program product for managing DRAM, the computer program product comprising a computer readable storage device having program code embodied therewith, the program code executable by a processing unit to:

track an operating state of each DRAM bank in a rank, wherein the state is selected from the group consisting of: active, waiting for a CAS command, and idle;

track a quantity of outstanding CAS commands in a request queue in relation to the tracked operating state of each bank, wherein the outstanding CAS commands are selected from the group consisting of: under-service of the CAS, and waiting for service of the CAS;

for each cycle, identify the tracked quantity of CAS commands waiting for service in a selected queue for the current cycle, and assessing the identified quantity in view of a predefined ratio; and manage the operating state of the banks based on the cycle assessment, including individually control the operating state of each of the banks, wherein the idle state consumes less power than the active state, and individual controlling the operating state includes delaying activation of an idle bank.

15. The computer program product of claim 14, wherein the program code to manage an operating state of the tracked banks further comprises, program code to restrict the quantity of active banks for the current cycle.

16. The computer program product of claim 15, further comprising program code to schedule issuance of an activate command to an idle bank, including program code to delay activation of the idle bank based on the cycle assessment.

17. The computer program product of claim 14, further comprising program code to identify at least two banks in the idle state, and select one of the banks responsive a scheduling policy, and change the state of the selected bank from idle to active.

18. The computer program product of claim 17, wherein the scheduling policy includes for each cycle program code to track a number of active banks in each rank and a number of CAS commands under service or waiting for service to the active banks in relation to the ratio.

19. The computer program product of claim 14, wherein the predefined ratio is calculated by a memory scheduler.

20. The computer program product of claim 14, wherein the predefined ratio is configurable.

* * * * *